(12) United States Patent
Taguchi

(10) Patent No.: US 11,490,529 B2
(45) Date of Patent: *Nov. 1, 2022

(54) DISPLAY DEVICE AND METHOD OF MANUFACTURING DISPLAY DEVICE

(71) Applicant: Japan Display Inc., Tokyo (JP)

(72) Inventor: Motoyumi Taguchi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/144,469

(22) Filed: Jan. 8, 2021

(65) Prior Publication Data
US 2021/0136935 A1 May 6, 2021

Related U.S. Application Data

(63) Continuation of application No. 16/366,653, filed on Mar. 27, 2019, now Pat. No. 10,893,620.

(30) Foreign Application Priority Data

Mar. 30, 2018 (JP) .............................. JP2018-069162

(51) Int. Cl.
*H05K 5/00* (2006.01)
*H05K 1/02* (2006.01)
(Continued)

(52) U.S. Cl.
CPC ......... *H05K 5/0017* (2013.01); *G02F 1/1345* (2013.01); *G02F 1/13452* (2013.01); *H01L 27/3276* (2013.01); *H05K 1/0296* (2013.01)

(58) Field of Classification Search
CPC ................ H05K 5/0017; H05K 1/0296; H01L 27/3276; G02F 1/1345; G02F 1/13452
See application file for complete search history.

(56) References Cited

U.S. PATENT DOCUMENTS 6,104,464 A * 8/2000 Adachi ................ H05K 1/0278
349/150
2010/0330338 A1* 12/2010 Boyce .................. H01L 23/4985
428/156

(Continued)

FOREIGN PATENT DOCUMENTS

JP   H03-145788    6/1991
JP   H8-212266 A   8/1996
(Continued)

OTHER PUBLICATIONS

Japanese Office Action dated Dec. 21, 2021 in corresponding Japanese Application No. 2018-069162.
(Continued)

*Primary Examiner* — Nathanael R Briggs
(74) *Attorney, Agent, or Firm* — K&L Gates LLP

(57) ABSTRACT

A display device is provided and includes a display panel; and a wiring board comprising a flexible base, a terminal electrically connected to the display panel, wherein the flexible base including a first surface, a second surface on an opposite side to the first surface, and a concavity in the second surface, the wiring board is mounted on the display panel and is bent so that the wiring board is opposed to a rear surface side of the display panel, and the concavity is provided in the portion of the wiring board which is bent.

20 Claims, 18 Drawing Sheets

(51) Int. Cl.
*H01L 27/32* (2006.01)
*G02F 1/1345* (2006.01)

(56) References Cited

U.S. PATENT DOCUMENTS

| | | | |
|---|---|---|---|
| 2013/0148312 A1* | 6/2013 | Han | H05K 1/028 |
| | | | 361/736 |
| 2014/0048778 A1 | 2/2014 | Park | |
| 2015/0255522 A1 | 9/2015 | Sato et al. | |
| 2016/0070304 A1 | 3/2016 | Shin et al. | |
| 2016/0105950 A1* | 4/2016 | Drzaic | H05K 3/0014 |
| | | | 156/196 |

FOREIGN PATENT DOCUMENTS

| | | |
|---|---|---|
| JP | H10-054981 A | 2/1998 |
| JP | 2003-163422 | 6/2003 |
| JP | 2004-252331 A | 9/2004 |
| JP | 2011-017970 A | 1/2011 |
| JP | 2011-018665 | 1/2011 |
| WO | 2009/038950 | 3/2009 |

OTHER PUBLICATIONS

Japanese Office Action dated Jun. 15, 2021 in corresponding Japanese Application No. 2018-069162.

* cited by examiner

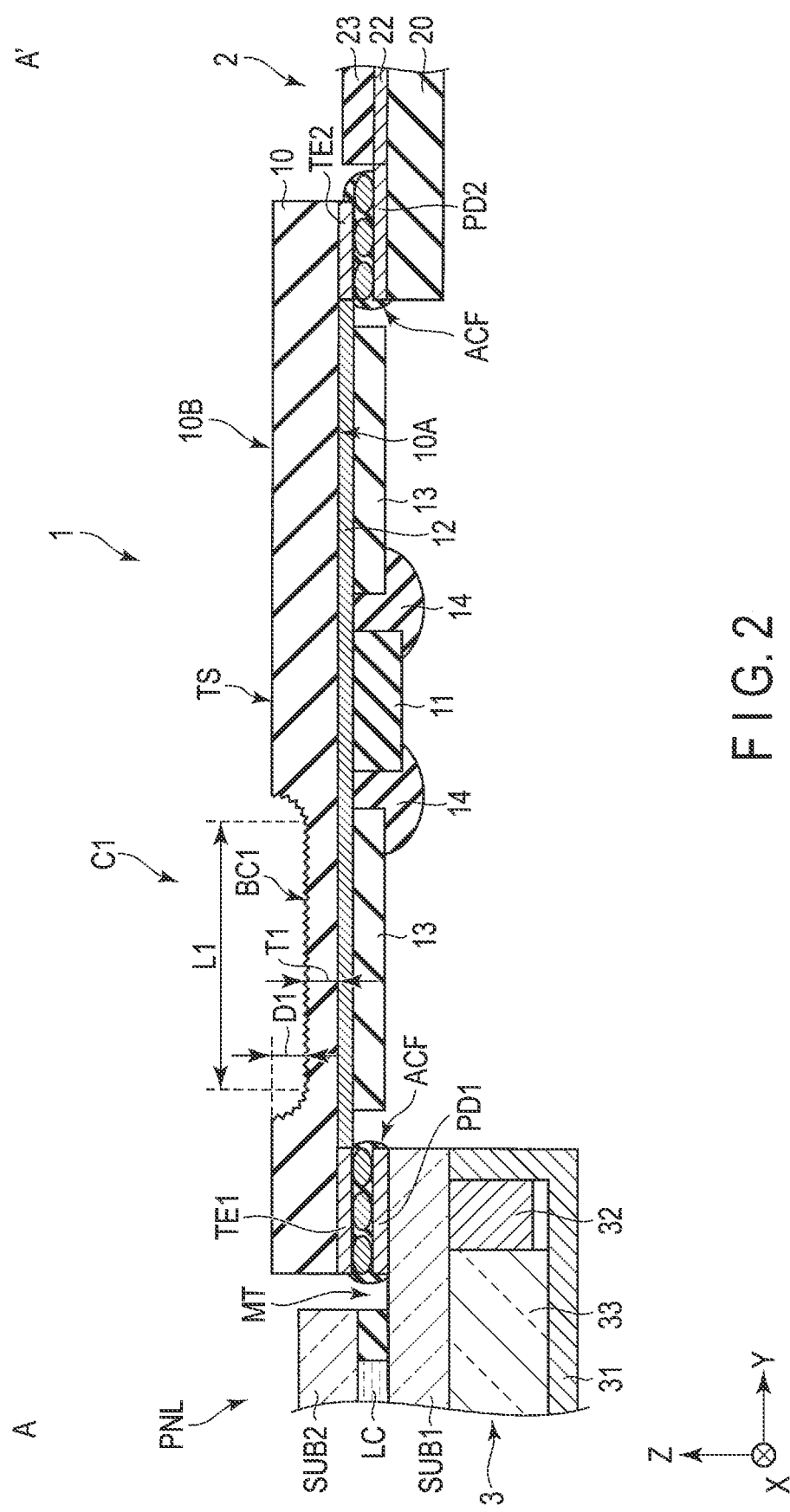
F I G. 2

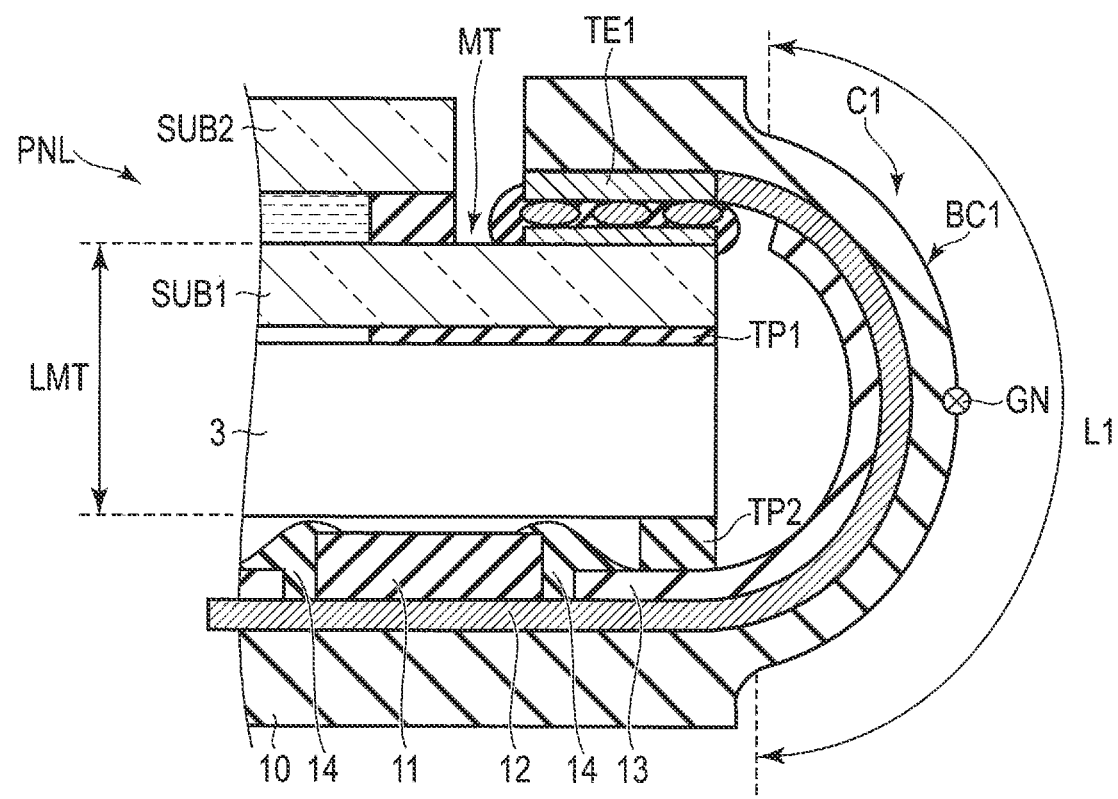
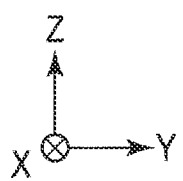
FIG. 3

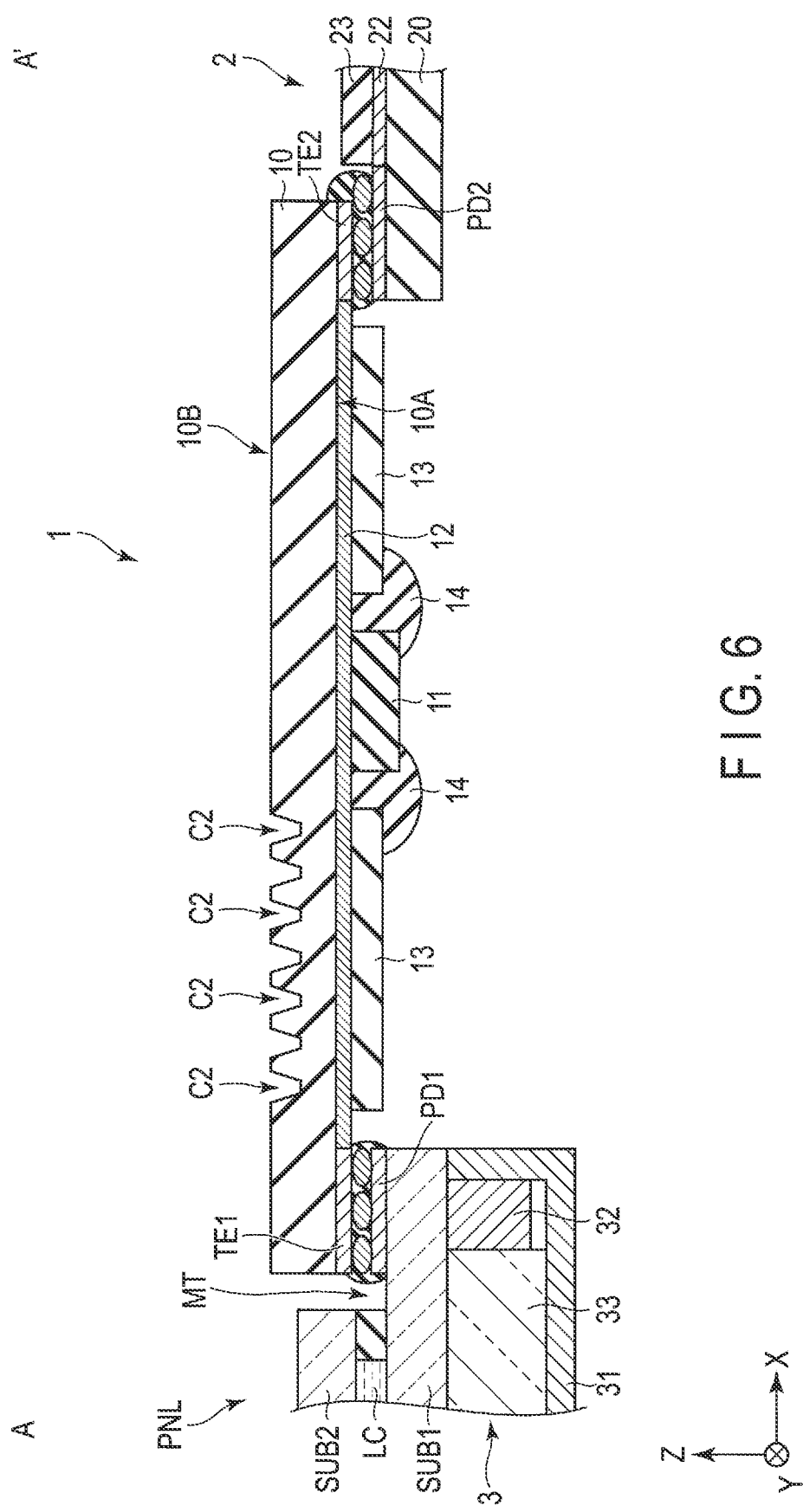
F I G. 6

DISPLAY DEVICE AND METHOD OF MANUFACTURING DISPLAY DEVICE

CROSS-REFERENCE TO RELATED APPLICATIONS

This application is a continuation of U.S. patent application Ser. No. 16/366,653, filed on Mar. 27, 2019, which application is based upon and claims the benefit of priority from Japanese Patent Application No. 2018-069162, filed Mar. 30, 2018, the entire contents of which are incorporated herein by reference.

FIELD

Embodiments described herein relate generally to a display device and a method of manufacturing the display device.

BACKGROUND

In display devices such as liquid crystal display devices, there is a demand of narrowing the frame. As an example of the narrowed frame, such a structure is known that a flexible wiring board is bent to a rear side of the display panel. However, such a wiring board may comprise an IC chip for driving the display panel PNL. In terms of the reliability in the connection to IC chips, the wiring board in many cases has a predetermined thickness. For this reason, it is sometimes difficult to maintain the shape of the display device due to the resilience caused by bending of the wiring board.

SUMMARY

The present application relates generally to a display device and method of manufacturing same.

According to one embodiment, a display device includes a display panel and a wiring board including a flexible base, a terminal electrically connected to the display panel, an IC chip, a wiring line which electrically connects the terminal and the IC chip. The base includes a first surface on which the IC chip and the terminal are provided, a second surface on an opposite side to the first surface, and a concavity in the second surface between the IC chip and the terminal.

BRIEF DESCRIPTION OF THE DRAWINGS

FIG. 2 is a cross section taken along line A-A' shown in FIG. 1.

FIG. 3 is a cross section showing a state where a wiring board 1 is bent.

FIG. 6 is a cross section showing a configuration example of a display device DSP according to the second embodiment.

DETAILED DESCRIPTION

Figure 1:
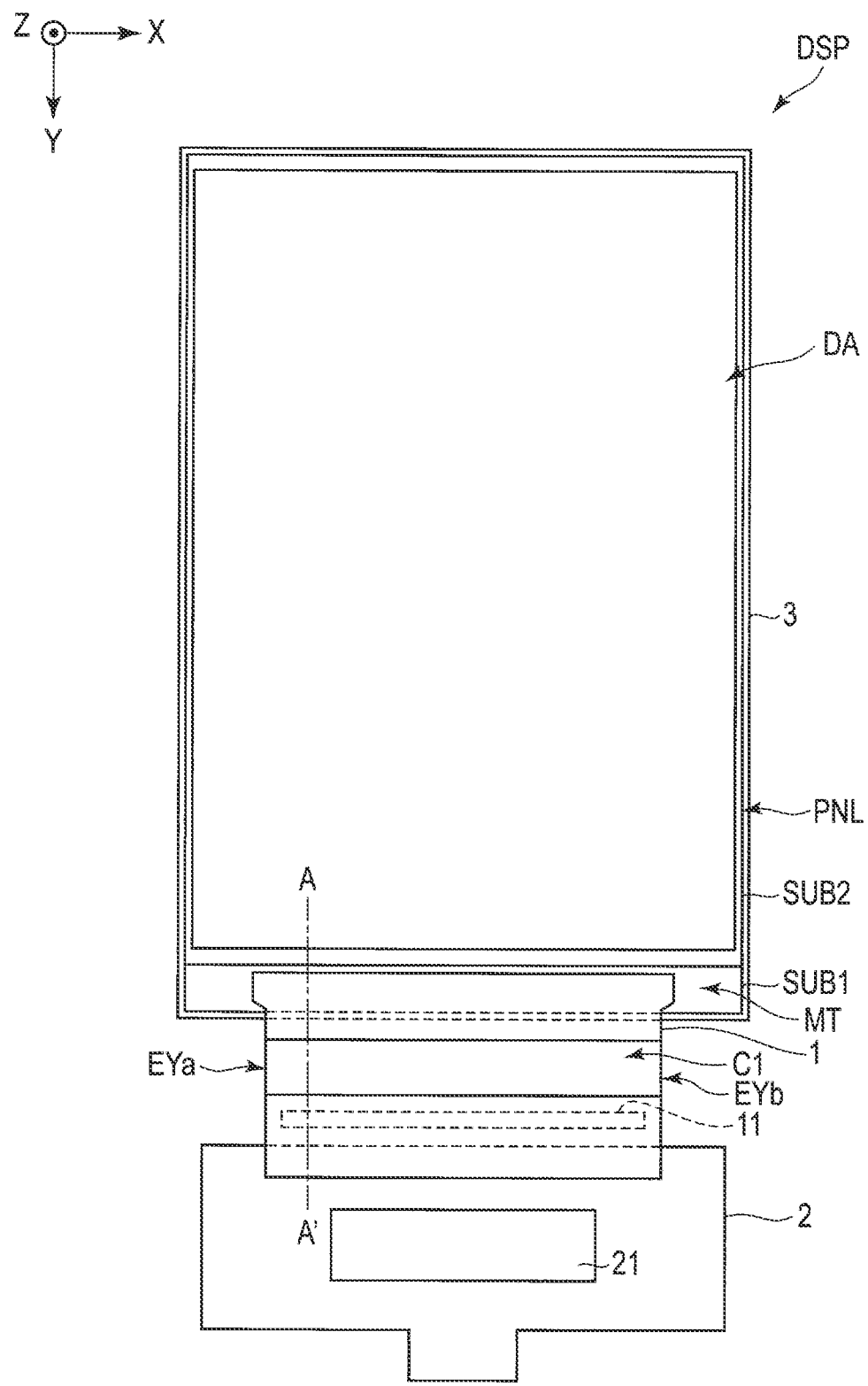
FIG. 1 is a plan view showing a configuration example of a display device DSP according to the first embodiment.

In general, according to one embodiment, a display device comprises a display panel and a wiring board including a flexible base, a terminal electrically connected to the display panel, an IC chip, a wiring line which electrically connects the terminal and the IC chip, the base comprising a first surface on which the IC chip and the terminal are provided, a second surface on an opposite side to the first surface, and a concavity in the second surface between the IC chip and the terminal.

According to another embodiment, a method of manufacturing a display device, includes electrically connecting a wiring board including a base comprising a first surface and a second surface on an opposite side to the first surface, and an IC chip provided on the first surface, to a display panel, and forming a concavity in a section of the second surface, located between the display panel and the IC chip.

According to another embodiment, a method of manufacturing a display device, comprises drawing a long-scale film from a reel, the long-scale film comprising a base extending over a plurality of effective portions, and a terminal and an IC chip provided in each of the effective portions on a first surface of the base, forming concavities a second surface of the base, on an opposite side to the first surface, each between the respective terminal and the respective IC chip, separating the effective portions each from the long-scale film, thus preparing a wiring board, and electrically connecting the terminal of the wiring board to a display panel.

Embodiments will now be described with reference to accompanying drawings. Note that the disclosure is presented for the sake of exemplification, and any modification and variation conceived within the scope and spirit of the invention by a person having ordinary skill in the art are naturally encompassed in the scope of invention of the present application. Moreover, in some cases, in order to make the description clearer, the widths, thicknesses, shapes, etc., of the respective parts are schematically illustrated in the drawings as compared to the actual modes. However, the schematic illustration is merely an example, and adds no restrictions to the interpretation of the invention.

In addition, in the specification and drawings, the structural elements, which have functions identical or similar to the functions described in connection with preceding drawings are denoted by like reference numbers, and an overlapping detailed description thereof is omitted unless otherwise necessary.

First Embodiment

FIG. 1 is a plan view showing a configuration example of a display device DSP according to the first embodiment. In the drawing, a first direction X, a second direction Y and a third direction Z are orthogonal to each other. Note that the first direction X, the second direction Y and the third direction Z may cross each other at an angle other than 90 degrees. In this specification, the direction towards the distal end of the arrow which shows the third direction Z is referred to as "up", and the direction opposite to the distal end the arrow is referred to as "down".

The display device DSP comprises a display panel PNL, a wiring board 1, a wiring board 2, a lighting unit 3 and the like. Note that, the wiring board 1 and the wiring board 2 may be called as print circuit board 1 and print circuit board 2.

The display panel PNL is, for example, quadrangular. In the example illustrated, the display panel PNL is formed into a rectangular shape comprising a pair of short sides along the first direction X, and a pair of long sides along the second direction Y, but the structure is not restricted to that of the example illustrated. The display panel PNL is, for example, a transmissive liquid crystal display panel which displays images by selectively transmitting light from the lighting unit 3. The display panel PNL comprises a first substrate SUB1, a second substrate SUB2 and a liquid crystal layer (not shown). The first substrate SUB1 and the second substrate SUB2 are located immediately above the lighting unit 3, and they oppose each other. A display area DA which displays images is located in a region where the first substrate SUB1 and the second substrate SUB2 oppose each other. In the example illustrated, the display panel PNL comprises a mounting portion MT extending along the first direction X. The mounting portion MT is equivalent to a portion of the first substrate SUB1, which extends from the second substrate SUB2 along the second direction Y. The display panel PNL may be a reflective type which displays images by selectively reflecting external light or light from the lighting unit 3, or a transreflective type provided for both display functions of the transmissive and reflective types. Moreover, the display panel PNL is not limited to a liquid crystal display panel, but may be an organic electroluminescent panel.

The wiring board 1 is mounted on the mounting portion MT, and is electrically connected to the display panel PNL. In this embodiment, the wiring board 1 is flexible. The wiring board 1 is formed into approximately a rectangular shape comprising long sides along the first direction X, and edges EYa and EYb extending along the second direction Y. For example, the wiring board 1 comprises an IC chip in its lower section. The IC chip 11 supplies various signals for displaying images on the display panel PNL. Further, the wiring board 1 comprises a concavity C1 between the display panel PNL and the IC chip 11. The concavity C1 is formed into substantially a belt-like shape having substantially a constant width and extending over between the edge EYa and the edge EYb along the first direction X.

A wiring board 2 is connected to the wiring board 1. For example, the wiring board 2 is a printed circuit board. The wiring board 2 comprises a capacitor 21 and the like. For example, the wiring board 2 is a flexible substrate whose entire body is bendable, but it may be a rigid substrate formed from a hard material such as glass epoxy, or may be a rigid flexible substrate.

FIG. 2 is a cross section taken along line A-A' shown in FIG. 1. Here, the figure shows a state before the wiring board 1 is bent, and the wiring board 1 is a flat plate parallel to an X-Y plane defined by the first direction X and the second direction Y.

The display panel PNL comprises a liquid crystal layer LC in addition to the first substrate SUB1 and the second substrate SUB2. The first substrate SUB1 is disposed immediately above the lighting unit 3. The liquid crystal layer LC is held between the first substrate SUB1 and the second substrate SUB2.

The lighting unit 3 comprises a case 31, a light source 32, a light guide 33, etc. Note that the optical sheet located between the light guide 33 and the first substrate SUB1 is omitted from illustration. The case 31 is formed of, for example, a metal such as aluminum, but may be formed of a resin. The light source 32 and the light guide 33 are accommodated in the case 31. For example, the light source 32 includes a light emitting diode. The light emitted from the light source 32 propagates in the light guide 33, and illuminates the display panel PNL.

The wiring board 1 comprises a base 10, an IC chip 11, a wiring line 12, a resin layer 13, a resin layer 14, a terminal TE1, a terminal TE2 and the like.

For example, the base 10 is formed into a plate-likes shape and of, for example, a flexible material such as polyimide. The base 10 comprises a first surface 10A on which the IC chip 11 and the like are formed, and a second surface 10B on an opposite side to the first surface 10A.

The wiring line 12 is formed on the first surface 10A. The terminal TE1 is formed in one end portion of the wiring line 12. The terminal TE1 is electrically connected to a pad PD1 located in the mounting portion MT of the display panel PNL via an anisotropically conductive film ACF. The terminal TE2 is formed in another end portion of the wiring line 12. The terminal TE2 is electrically connected to a pad PD2 of the wiring board 2 via the anisotropically conductive film ACF. The IC chip 11 is electrically connected to the wiring line 12 between terminal TE1 and terminal TE2. In the example illustrated, the IC chip 11 is located approximately at the center of the wiring board 1 along the second direction Y. The resin layer 13 covers the wiring line 12. More specifically, the resin layer 13 is formed between the terminal TE1 and the IC chip 11 and between the terminal TE2 and the IC chip 11. The resin layer 14 is formed between the IC chip 11 and the resin layer 13, and covers the wiring line 12. With the resin layer 13 and the resin layer 14 thus formed, the corrosion and the like of the wiring line 12 can be suppressed.

The concavity C1 is formed in the second surface 10B. The concavity C1 is located between the terminal TE1 and the IC chip 11 along the second direction Y. The concavity C1 is formed in a position which overlaps the resin layer 13. In this embodiment, the concavity C1 has a length L1 which is greater than a depth D1. Here, the length L1 of the concavity C1 is, more specifically, a length of a bottom portion BC1 of the concavity C1. In the region where the concavity C1 is formed, the base 10 has a thickness T1 which is substantially constant. Here, the length L1 is defined along the second direction Y. The depth D1 and the thickness T1 are defined along the third direction X. The depth D1 is less than the thickness T1. The depth D1 is, for example, 10 μm or more but 20 μm or less. The thickness T1 is, for example, 15 μm or more but 25 μm or less.

As will be described later in detail, the concavity C1 with such a configuration is formed by mechanically polishing (buffing) the base 10. In the second surface 10B, the concavity C1 polished and the upper surface TS not polished are different from each other in finished condition. In this embodiment, the concavity C1 has a surface coarseness rougher than that of the upper surface TS. Therefore, the concavity C1 has gloss less than that of the upper surface TS. For example, the concavity C1 is dull.

The wiring board 2 comprises a substrate 20, a wiring line 22, a protective member 23 and the like. For example, the substrate 20 is formed of a flexible material such as polyimide. The wiring line 22 is formed on the substrate 20. The pad PD2 is formed in one end portion of the wiring line 22. The protective member 23 covers the wiring line 22.

FIG. 3 is a cross section showing a state in which the wiring board 1 is bent. The display device DSP is accommodated in a housing or the like while the wiring board 1 is bent as shown in FIG. 3. In the state where the wiring board 1 is bent, the IC chip 11 opposes the lighting unit 3 in a lower portion of the lighting unit 3. The wiring board 1 and the lighting unit 3 are adhered together with, for example, an adhesive member TP2 such as a double-sided tape provided between the wiring board 1 and the lighting unit 3. Thus, the bent state of the wiring board 1 is maintained. Moreover, the lighting unit 3 and the display panel PNL are adhered together with an adhesive member TP1 such as a double-sided tape provided between the lighting unit 3 and the first substrate SUB1.

For example, the wiring board 1 is bent at an axis along the first direction X, as a center, in a region where at least the concavity C1 is formed. That is, in the state where the wiring board 1 is bent, the bottom portion BC1 forms a curved surface, and its generator GN is parallel to the first direction X. The generator GN may be referred to as "bending line". In the example illustrated, the concavity C1 coincides with the bent region of the wiring board 1. The length L1 of the bottom portion BC1 is greater than a thickness LMT of the mounting portion MT and the lighting unit 3 together. Here, the thickness LMT is defined along the third direction Z. The thickness of the mounting portion MT is equivalent to the thickness of the first substrate SUB1.

In the first embodiment described above, the resin layer 13 is equivalent to a first resin layer, and the resin layer 14 is equivalent to a third resin layer. Moreover, the edge EYa is equivalent to a first edge, and the edge EYb is equivalent to a second edge.

According to this embodiment, the concavity C1 is formed in the second surface 10B of the flexible base 10. The concavity C1 is located between the display panel PNL and the IC chip 11. With the concavity C1 formed to have such a configuration, the thickness of the base 10 is reduced and the flexibility of the base 10 can be improved. Thus, the wiring board 1 can be easily bent, and also the resilience of the wiring board 1, which is caused by bending which can reduced. As a result, separation of the lighting unit 3 and the display panel PNL from each other, which may be caused by the resilience of the wiring board 1, can be suppressed.

In particular, as described with reference to FIG. 2, the mounting portion MT of the display panel PNL overlaps the light source 32 of the lighting unit 3. With this structure, if the lighting unit 3 is separated from the mounting portion MT, the region of the display area DA, which is near the mounting portion MT cannot be sufficiently illuminated, possibly causing non-uniformity in display. According to this embodiment, the separation of the lighting unit 3 and the display panel PNL from each other can be inhibited, and therefore the degradation in display quality can be suppressed.

Moreover, the bent state of the wiring board 1 can be stably maintained, and therefore the reliability of the display device DSP can be improved. This embodiment is effective especially for display devices with a narrow frame, which have a small adhesion area between a display panel PNL and a lighting unit 3.

Next, a method of manufacturing the display device DSP according to the first embodiment will be described with reference to FIGS. 4 and 5. In this embodiment, the concavity C1 is formed by polishing the second surface 10B of the base 10.

Figure 4:
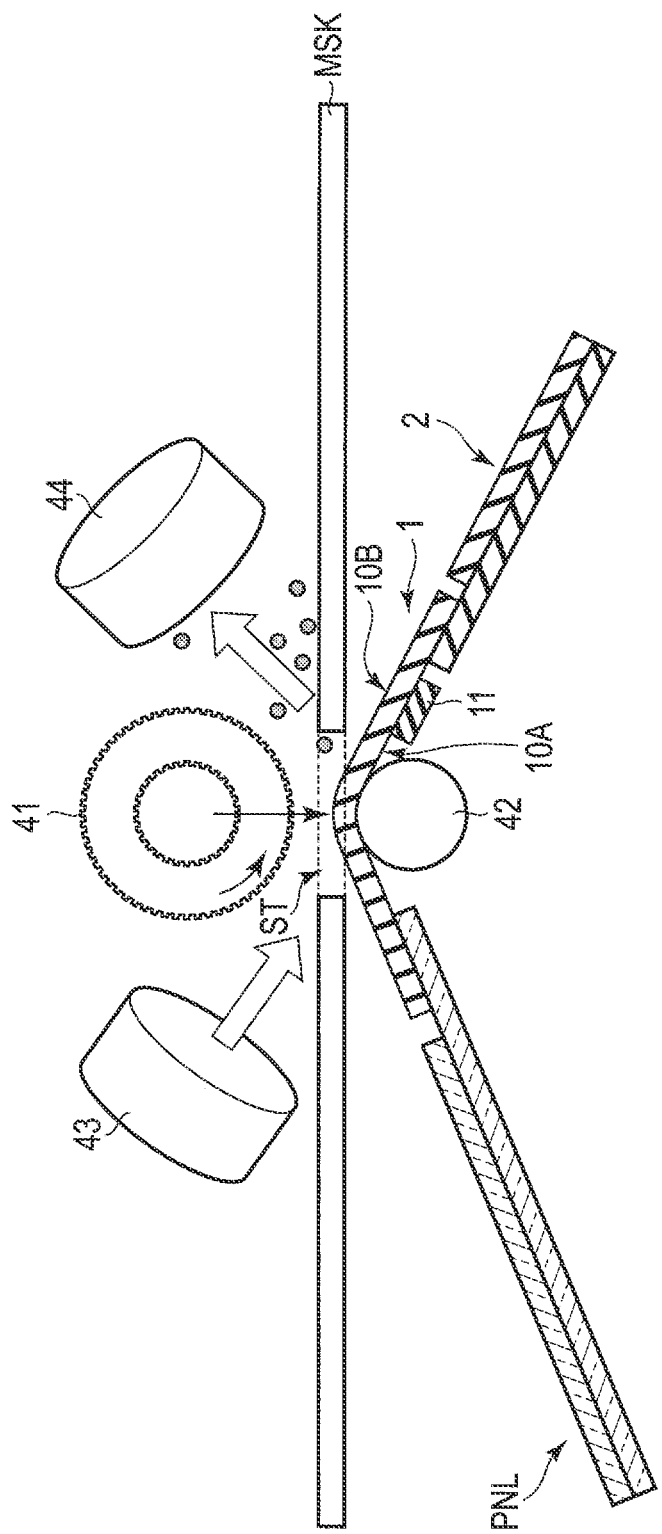
FIG. 4 is a diagram showing an example of a method of manufacturing the display device DSP comprising a concavity C1.

FIG. 4 is a diagram showing an example of the method of manufacturing the display device DSP comprising the concavity C1. In the example shown in FIG. 4, the concavity C1 is formed after the wiring board 1 is electrically connected to the display panel PNL and the wiring board 2.

The wiring board 1 is set to a shaft 42 while the wiring board 1 is electrically connected to the display panel PNL and the wiring board 2. The second surface 10B is covered by a masking plate MSK. The masking plate MSK comprises a slit ST. The slit ST exposes the second surface 10B located between the display panel PNL and the IC chip 11. A first surface 10A side of the base 10 is supported by the shaft 42. Note that, between the shaft 42 and the first surface 10A, the resin layer 13 shown in FIG. 2 may be formed, or the resin layer 13 may be formed after polishing the second surface 10B.

After that, a roll-like buff 41 is descended toward the slit ST, and the portion of the second surface 10B, which is exposed by the slit ST, is polished as the buff 41 is rotated. The buff 41 having such a structure is formed of, for example, a nonwoven fabric, ceramics or the like. Dust particles produced by polishing the base 10 are collected by a blower 43 and a dust catcher 44. The buff 41 is located between the blower 43 and the dust catcher 44. In the example illustrated, the buff 41 is rotated counter-clockwise, and the blower 43 blows air towards the slit ST in accordance with the rotation direction of the buff 41.

With use of the masking plate MSK, it is possible to selectively set a region of the second fields 10B, to be polished by the buff 41, and inhibit particles produced by polishing from attaching to the display device DSP. Note that to remove the particles left over even after collecting, a step of washing with, for example, water may be added.

Figure 5:
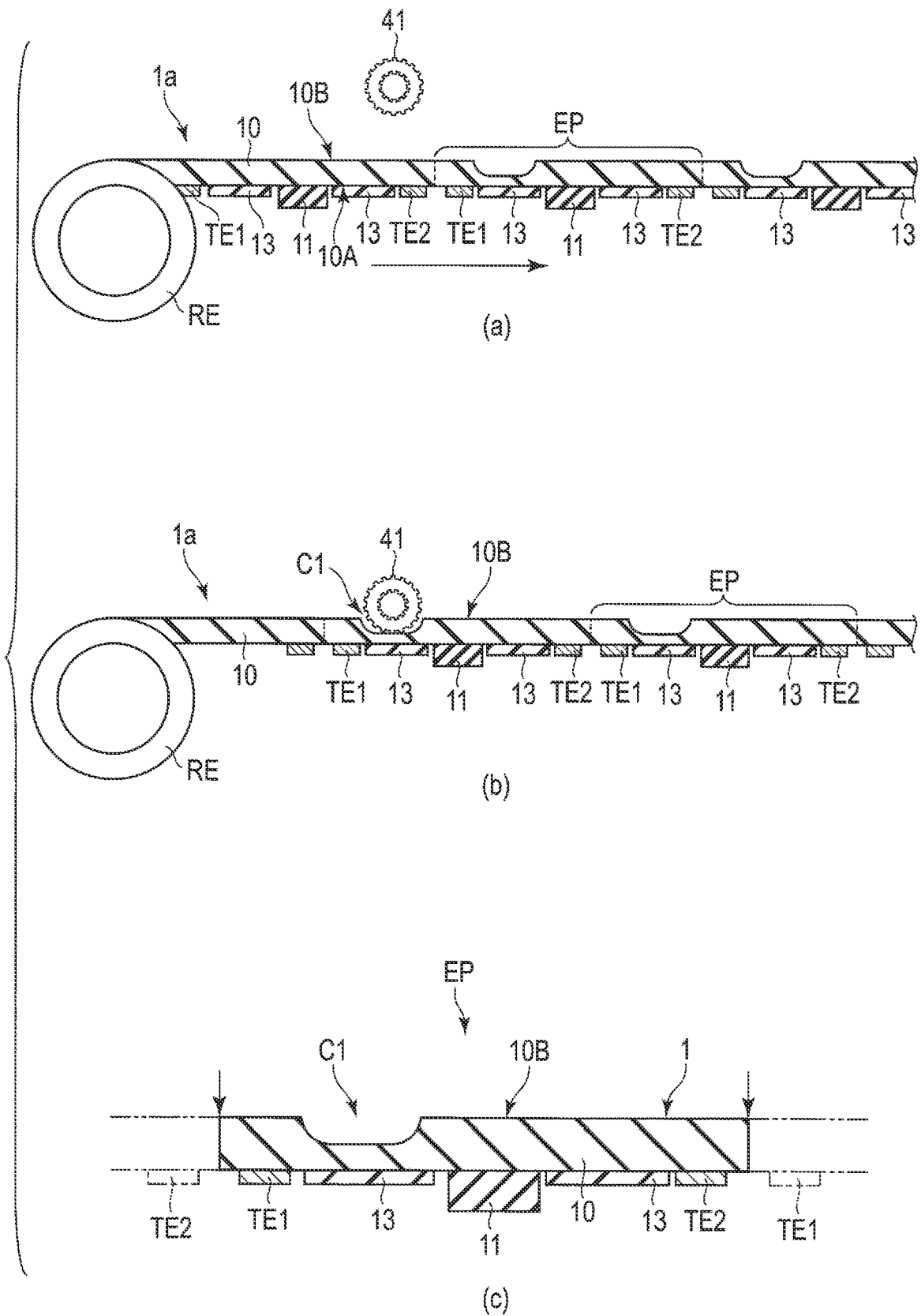
FIG. 5 is a diagram showing another example of the method of manufacturing the display device DSP comprising a concavity C1.

FIG. 5 is a diagram showing another example of the method of manufacturing the display device DSP comprising the concavity C1. In the example shown in FIG. 5, the concavity C1 is formed before the wiring board 1 is connected to the display panel PNL and the wiring board 2. More specifically, the concavity C1 is formed in a long-scale film 1a, from which the wiring board 1 is divided as an individual piece.

As shown in FIG. 5, part (a), the long-scale film 1a comprises, in addition to the base 10, a plurality of IC chips, a plurality of terminals TE1 and TE2, wiring lines (not shown), resin layers 13 and the like. The base 10 is formed to extend over a plurality of effective portions EP. The effective portions EP are of a portion equivalent to one piece of wiring board 1, and each include one terminal TE1, one IC chip 11 and one terminal TE2. The IC chip 11, the terminal TE1, and the terminal TE2 are provided on the first surface 10A of the base 10. For example, the long-scale film 1a is installed in a state where it is wound around a reel RE, and is pulled out from the reel RE by a predetermined length for each piece. In the example illustrated, the long-scale film 1a is fed toward a right-hand side of the figure. The terminal TE1, the IC chip 11 and the terminal TE2 are arranged in this order along the feeding direction of the long-scale film 1a. The buff 41 is disposed in an upper portion of the long-scale film 1a, that is, a second surface 10B side of the base 10.

Next, as shown in FIG. 5, part (b), when the long-scale film 1a is fed by a predetermined distance, the buff 41 opposes the second surface 10B between the terminal TE1 and the IC chip 11. Subsequently, the buff 41 is descended toward the base 10 and polishes the second surface 10B. As a result, between the terminal TE1 and the IC chip 11, that is, in a region which overlaps the resin layer 13, the concavity C1 is formed.

Next, as shown in FIG. 5, part (c), the long-scale film 1a is divided into effective portions EP. The long-scale film 1a is cut in each region between each respective adjacent pair of a terminal TE1 and a terminal TE2. Thus, the wiring board 1 comprising the concavity C1 is prepared. Then, the wiring board 1 is electrically connected to the display panel PNL and the wiring board 2, and thus the display device DSP is formed. Note that after the formation of the concavity C1, a washing step may be added if needed.

Second Embodiment

FIG. 6 is a cross-sectional view showing a configuration example of the display device DSP according to the second embodiment. The second embodiment is different from the first embodiment in that the base 10 comprises a slit-like concavity C2. The concavity C2 is formed in the second surface 10B of the base 10. In the cross section of the wiring board 1 illustrated, a plurality of concavities C2 are located between the terminal TE1 and the IC chip 11, and are arranged along the second direction Y at intervals. The concavities C2 are formed in the positions which overlap the resin layer 13.

Figure 7:
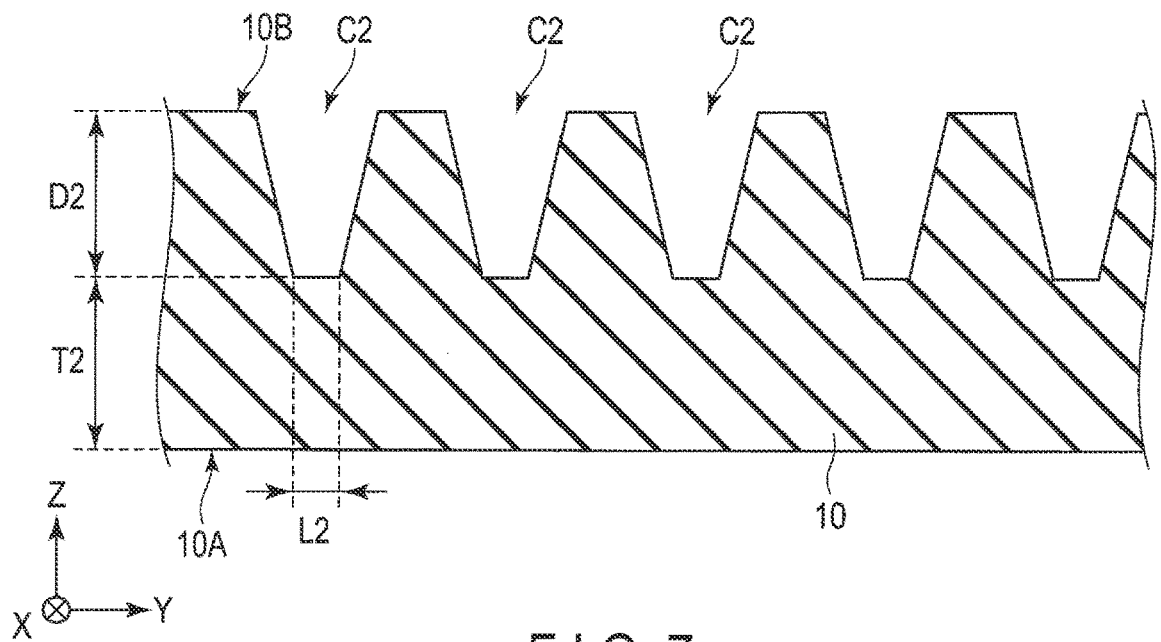
FIG. 7 is an enlarged cross section of a base 10 of a wiring board 1 shown in FIG. 6.

FIG. 7 is an enlarged cross section showing the base of the wiring board 1 shown in FIG. 6. In each concavity C2, a bottom portion BC2 has a length L2 which is less than a depth D2 of the concavity C2. Each concavity C2 is formed into a tapered shape which narrows down toward the first surface 10A from the second surface 10B. The depth D2 is, for example, 10 µm or more but 20 µm or less, and the thickness T1 is, for example, 15 µm or more but 25 µm or less.

Figure 8:
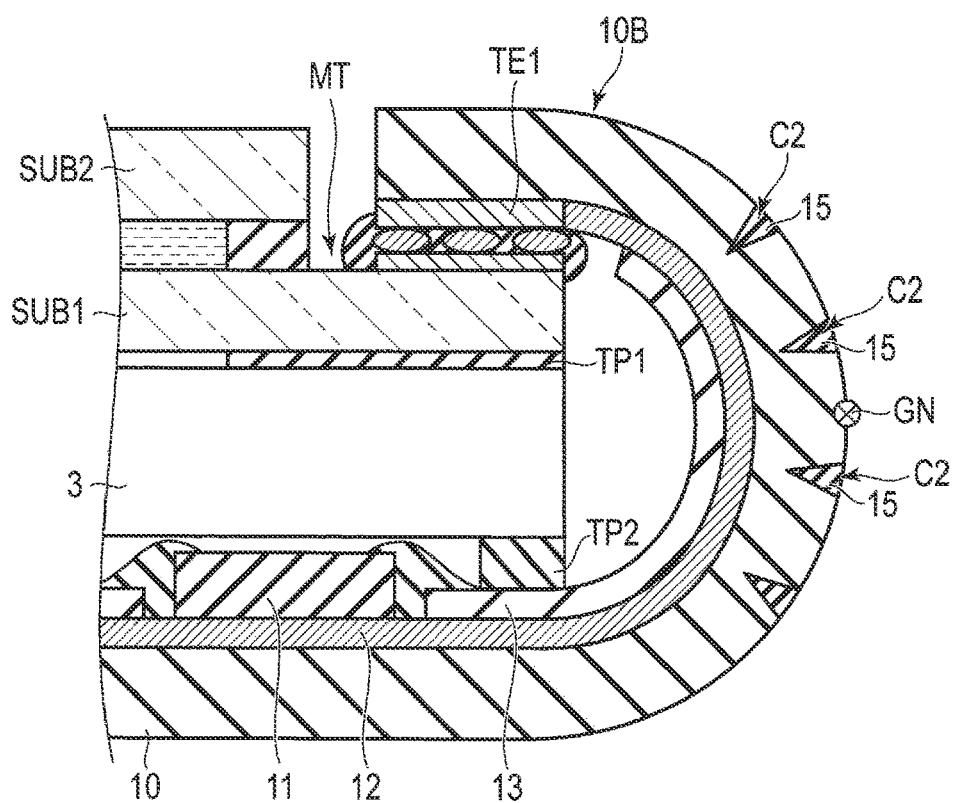
FIG. 8 is a diagram showing a state of the wiring board 31 shown in FIG. 6 when bent.

FIG. 8 is a diagram showing the bent state of the wiring board 1 shown in FIG. 6. The resin layer 15 is placed in the concavities C2. The resin layer 15 is applied into the concavities C2 while the wiring board 1 is bent and hardened thereafter. For example, the resin layer 15 may be an ultraviolet-curing resin which is cured by irradiation of ultraviolet rays, or a thermosetting resin which is cured by heating.

In this embodiment as well, the concavities C2 are formed in the region where the wiring board 1 is bent, and therefore advantageous effects similar to those of as the first embodiment can be obtained. Further, the resin layer 15 is placed in the concavities C2 in the state where the wiring board 1 is bent, the resilience caused by bending the base 10 can be further reduced, thereby making it possible to stably maintain the bent state of the wiring board 1. Moreover, cracking of the wiring board 1, which may start from any of the concavities C2 when the wiring board 1 is bent, can be inhibited.

Next, another example of the second embodiment will be described with reference to FIGS. 9 to 17. Here, the descriptions will be made while referring to the plan view showing the state before the wiring board 1 is bent. Note that a bending line GN (generator) along which the wiring board 1 is bent is also illustrated.

Figure 9:
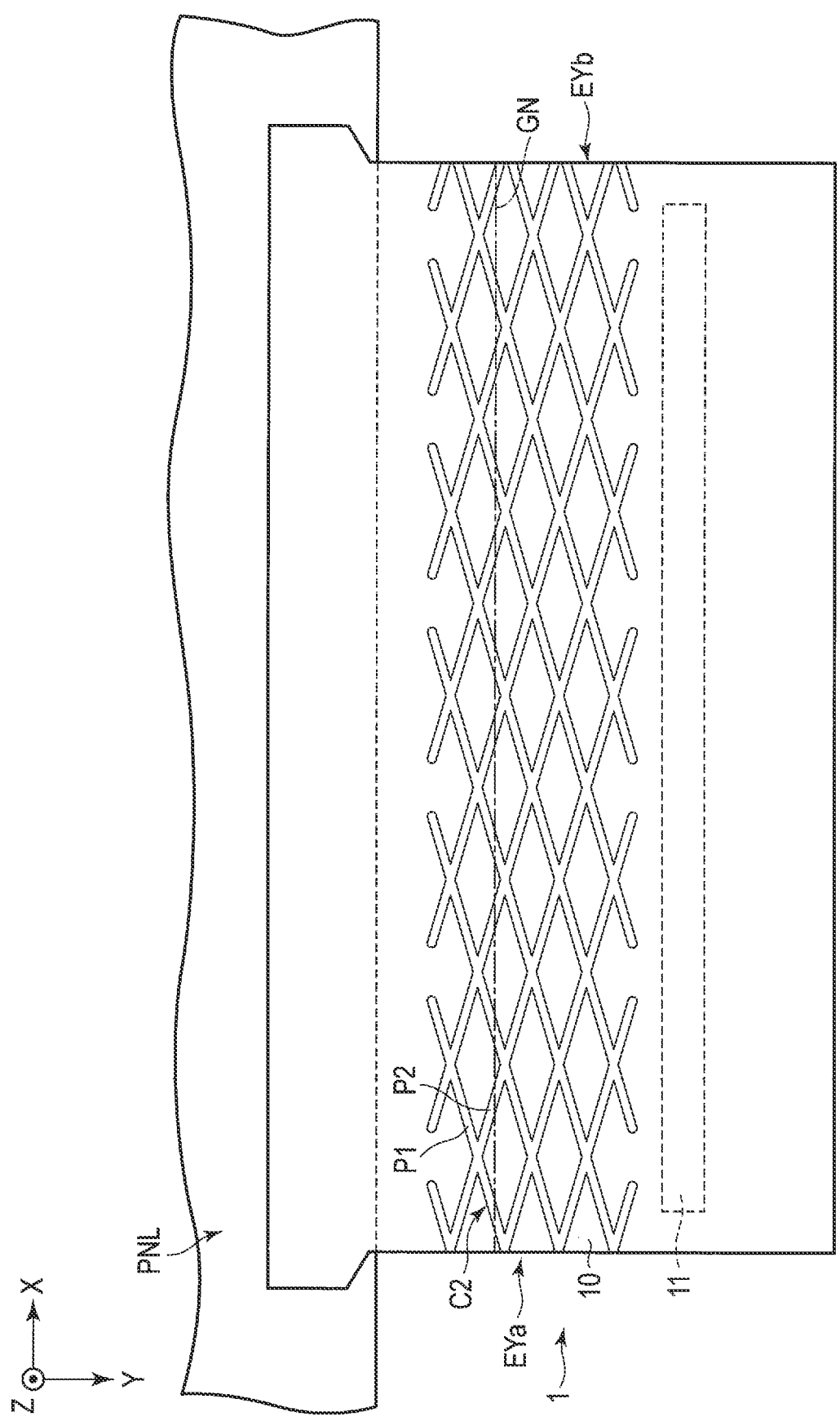
FIG. 9 which is a plan view showing the shape of a concavity C2 shown in FIG. 6.

FIG. 9 is a plan view showing a configuration of the concavity C2 shown in FIG. 6. The concavity C2 is located between the display panel PNL and the IC chip 11. The concavity C2 is formed into a mesh, and continuously extends along the first direction X between the edge EYa and the edge EYb. More specifically, the concavity C2 comprises a plurality of linearly extending portions P1 and a plurality of linearly extending portions P2. The portions P1 extend along a direction which intersects the bending line GN, and are arranged parallel to each other at intervals. The portions P2 extend along a direction which intersects the bending line GN and the portions P1 and are arranged parallel to each other at intervals.

Figure 10:
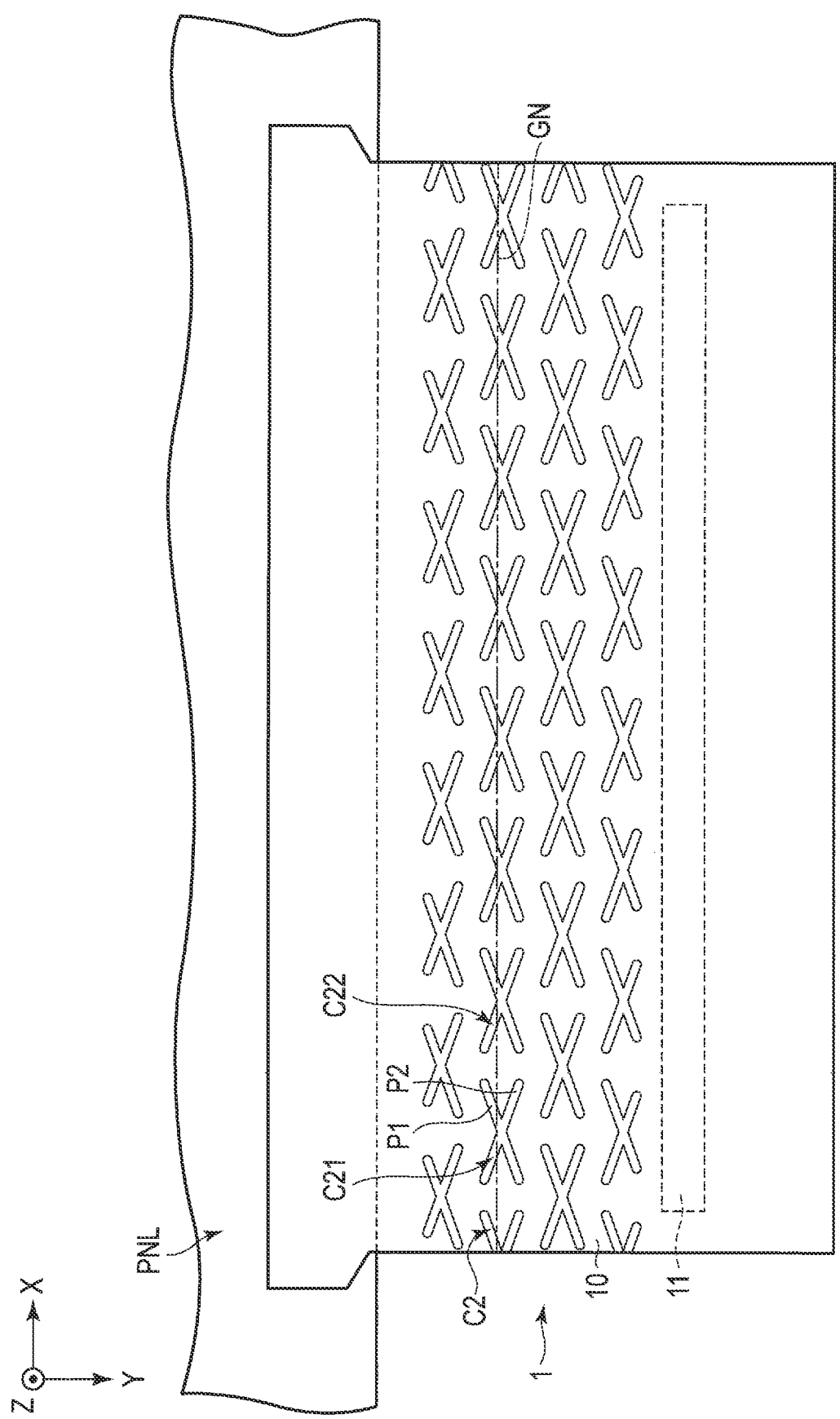
FIG. 10 is a plan view showing another example of the wiring board 1.

The example shown in FIG. 10 is different from that shown in FIG. 9 in that a plurality of concavities C2 are formed in the second surface 10B. For example, concavities C21 and C22 are arranged along the first direction X at intervals. The concavities C21 and C22 have substantially the same shape, which is, in the example illustrated, a cross (or a shape of X). The concavities C21 each comprise a portion P1 and a portion P2 which cross each other. The portions P1 and P2 each intersect the bending line GN. The example shown in FIG. 10 is a case where the portions P1 and the portions P2 shown in FIG. 9 are respectively discontinuous.

Figure 11:
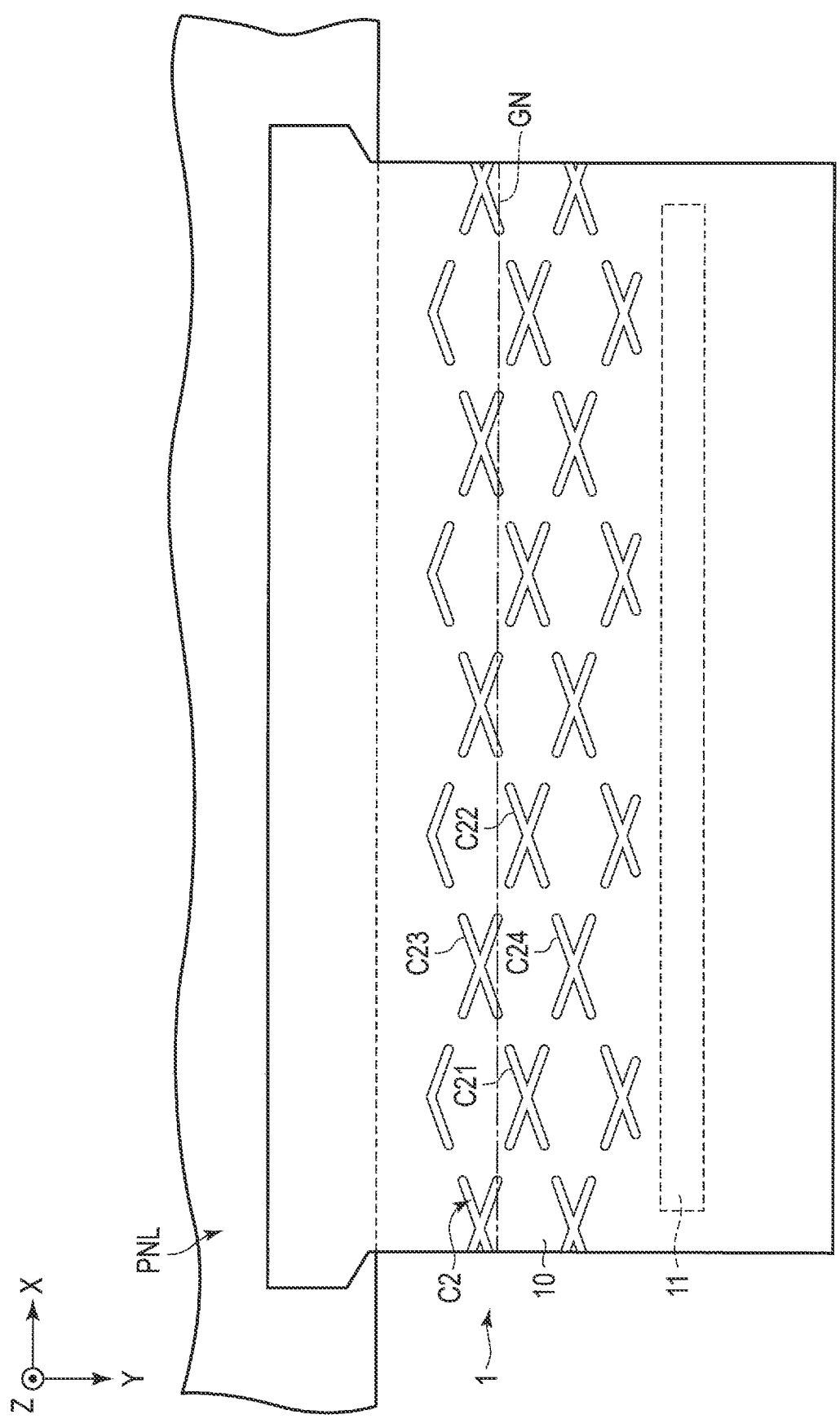
FIG. 11 is a plan view showing another example of the wiring board 1.

The example shown in FIG. 11 is different from that of FIG. 10 in that intervals between adjacent pairs of concavities C2 are greater. For example, between an adjacent pair of a concavity C21 and a concavity C22 arranged along the first direction X, concavities C23 and C24 are located along the second direction Y. Note that the concavity C2 located in an end portion (the outermost circumference) may be formed into a V shape. In the example illustrated, the concavities C2 most close to the display panel PNL along the second direction Y are formed into a V shape.

Figure 12:
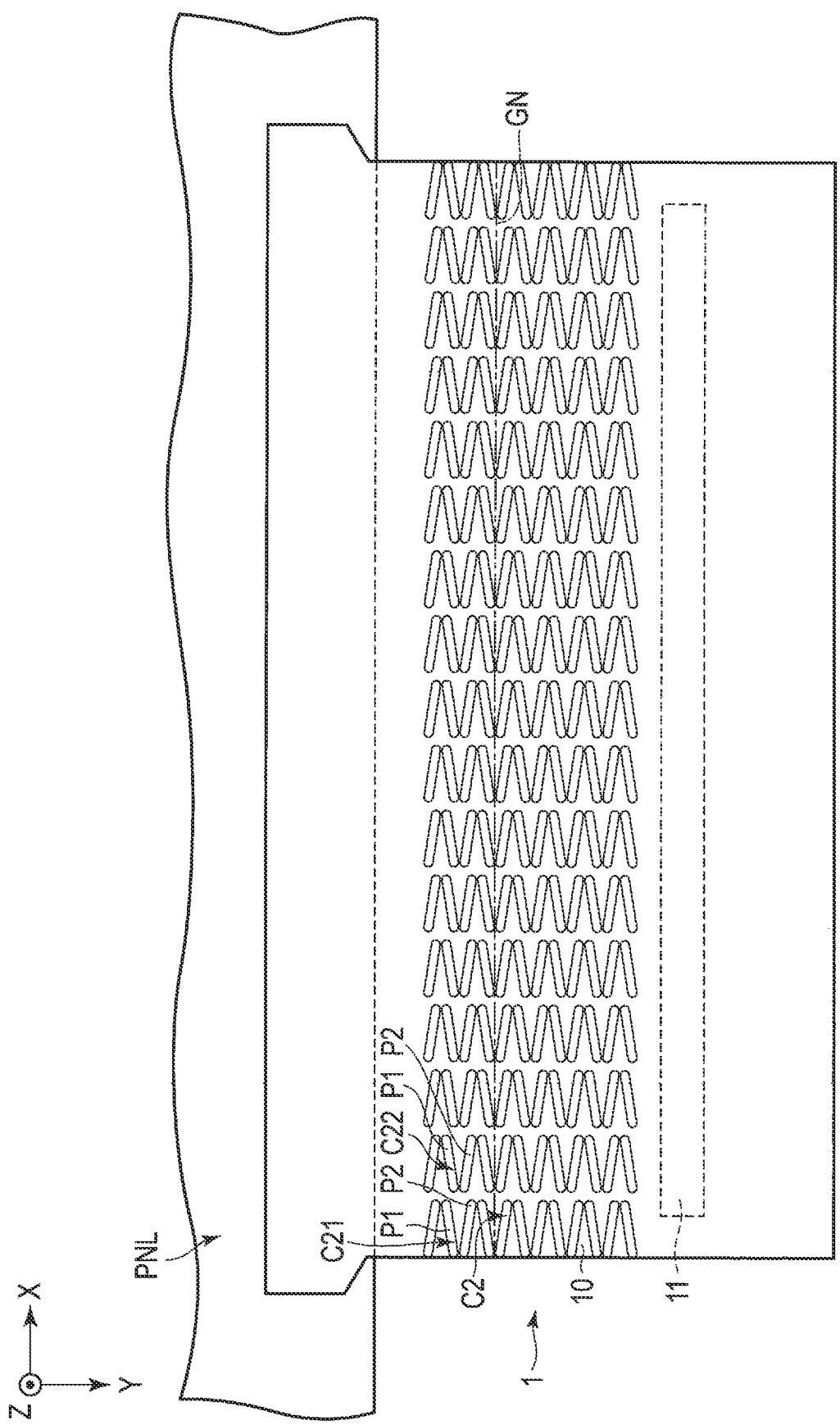
FIG. 12 is a plan view showing another example of the wiring board 1.

The example shown in FIG. 12 is different from that of FIG. 10 in that each of the concavities C21 and C22 is formed into a V shape (a wedge shape). That is, in each pair, the portion P1 and the portion P2 does not cross each other. In the example illustrated, the portion P1 and the portion P2 are separated from each other, but they may be connected to each other. The portions P1 and P2 each extend along a direction which intersects the bending line GN.

Figure 13:
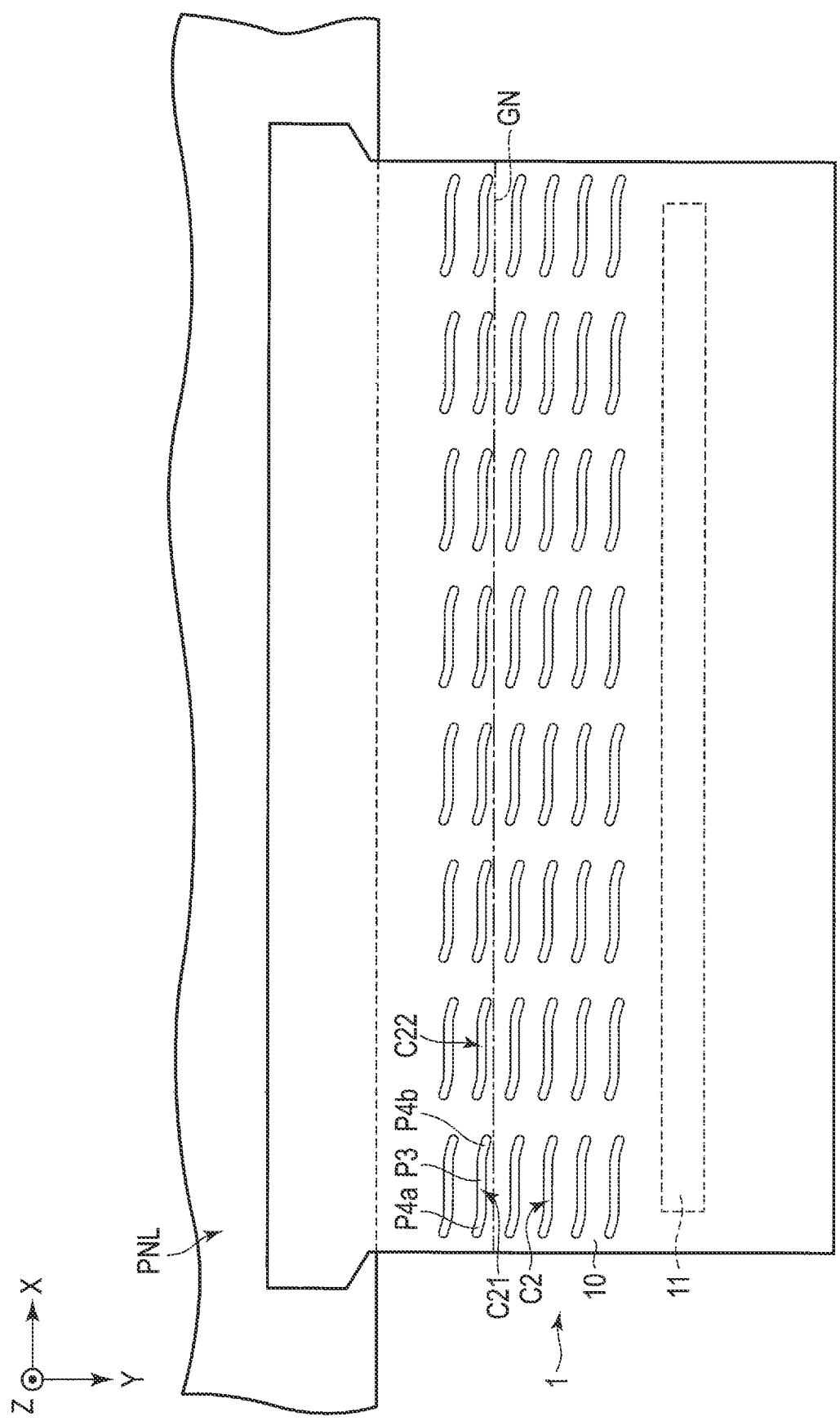
FIG. 13 is a plan view showing another example of the wiring board 1.

The example shown in FIG. 13 is different from that of FIG. 10 in that each of the concavities C21 and C22 is formed into a linear shape but crooked in both end portions. In the example illustrated, each of the concavities C21 and C22 comprises a portion P3 extending along the bending line GN, and end portions P4a and P4b extending along a direction which intersects the bending line GN. The end portion P4a and the end portion P4b extend in directions opposite from each other. More specifically, the end portion P4a extends toward a display panel PNL side from the portion P3, and the end portion P4b extends toward an IC chip 11 side from the portion P3.

Figure 14:
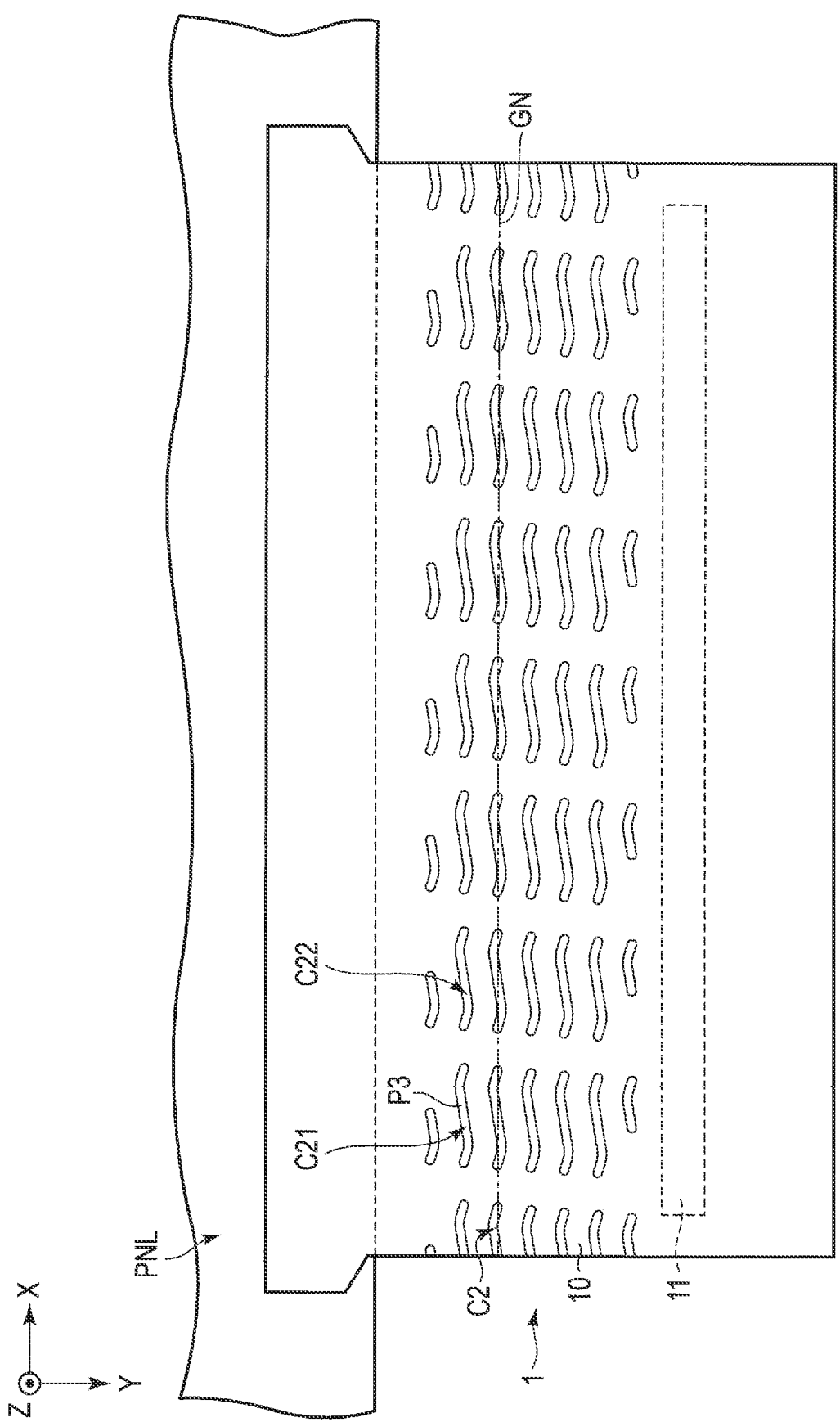
FIG. 14 is a plan view showing another example of the wiring board 1.

The example shown in FIG. 14 is different from that of FIG. 13 in that the portion P3 extends along a direction which intersects the bending line GN. In this configuration, both end portions of each of the concavities C21 and C22 are crooked more greatly than those in the example shown in FIG. 13. In the example illustrated, crooking angles in all the concavities C2 are equal to each other, but they may be different. For example, those of the concavities C2, which overlap the bending line GN may be crooked more greatly than the other concavities C2.

Figure 15:
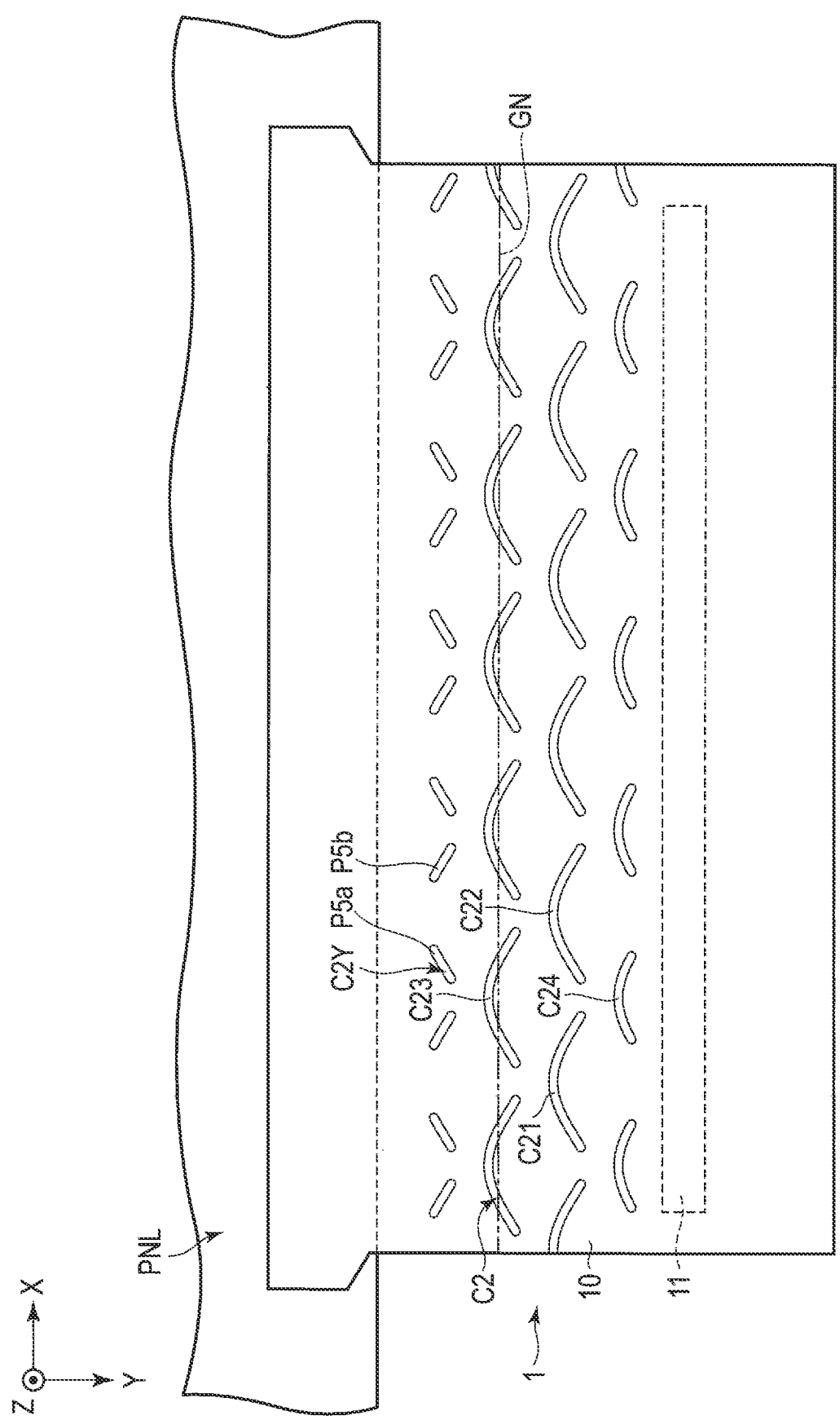
FIG. 15 is a plan view showing another example of the wiring board 1.

The example shown in FIG. 15 is different from that of FIG. 13 in that the concavities C2 are each formed into a curvy shape. For example, the concavities C2 each have a convex shape whose central portion protrudes toward a direction opposite to the second direction Y, that is, toward the display panel PNL. The concavities C21 and C22 arranged along the first direction X are located, respectively, between the concavities C23 and C24 arranged along the second direction Y. For example, along the first direction X, a central portion of the concavity C23 and a central portion of the concavity C24 are located between the concavity C21 and the concavity C22 in each set. In the example illustrated, concavities C2Y most close to the display panel PNL along the second direction Y are formed in parts. More specifically, the shape of the concavity C2Y is equivalent to that of a concavity C2 from which a central portion thereof is removed. Thus, in the example illustrated, each concavity C2Y comprises a portion P5a and a portion P5b which are separated from each other. The portion P5a and the portion P5b extend in directions which cross each other.

Figure 16:
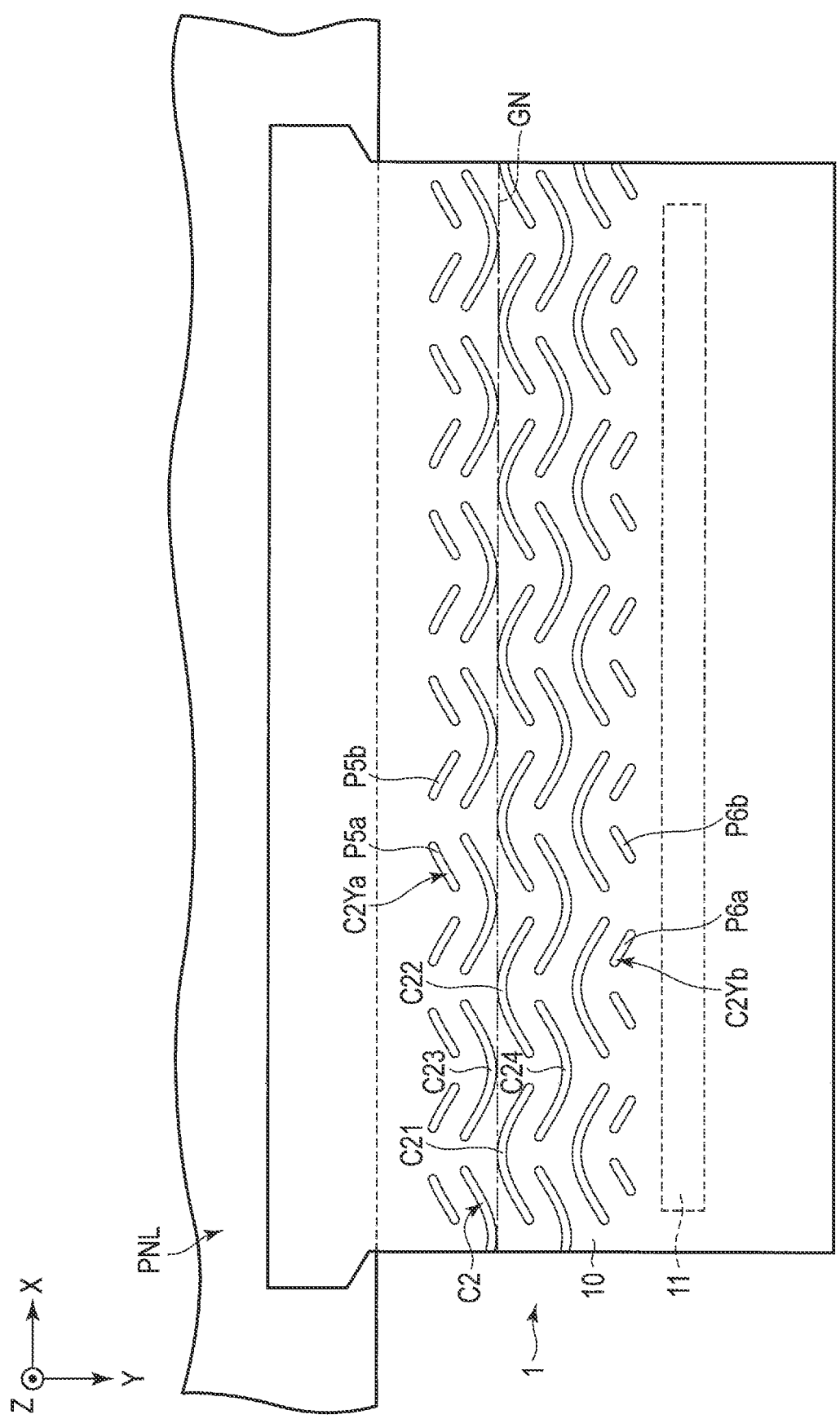
FIG. 16 is a plan view showing another example of the wiring board 1.

The example shown in FIG. 16 is different from that of FIG. 15 in that the concavities C23 and C24 each have a convex shape protruding towards a direction opposite to the concavities C21 and C22. That is, the concavities C23 and C24 have a convex towards a direction spaced away from the display panel PNL. In the example illustrated, the central portion of the concavity C23 and the central portion of the concavity C24 are located between the concavity C21 and the concavity C22, but the central portions of all the concavities C2 may be arranged along the second direction Y. In this case, the central portions which protrude each as a convex toward the display panel PNL, and the central portions which protrude each as a convex in the direction spaced away from the display panel PNL are arranged alternately along the second direction Y.

In the example illustrated, along the second direction Y, concavities C2Ya most close to the display panel PNL and concavities C2Yb most distant from the display panel PNL are formed in parts. More specifically, the shape of each concavity C2Ya is equivalent to that of a concavity C21 from which a central portion thereof is removed, and the shape of each concavity C2Yb is equivalent to that of a concavity C23 from which a central portion thereof is removed. With this structure, each concavity C2Ya comprises a portion P5a and a portion P5b separated from each other, and each concavity C2Yb comprises a portion P6a and a portion P6b separated from each other. The portion P5a and the portion P6a extend respectively in directions which cross each other. The portion P5b and the portion P6b extend respectively in directions which cross each other.

Figure 17:
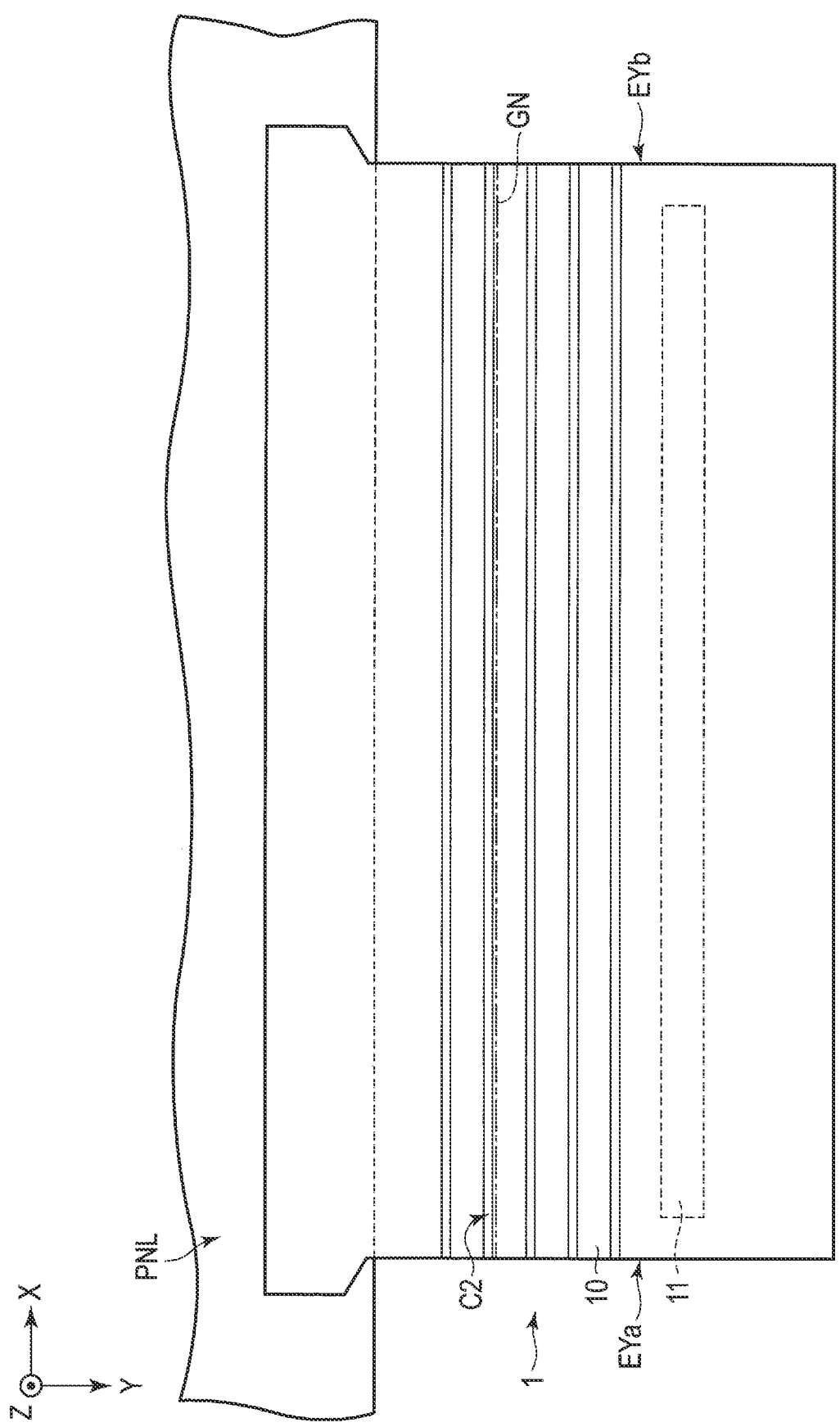
FIG. 17 is a plan view showing another example of the wiring board 1.

The example shown in FIG. 17 is different from that of FIG. 10 in that the concavities are formed into a straight line shape along the bending line GN. The concavities C2 are arranged along the second direction Y at intervals. In the example illustrated, the concavities C2 are each formed continuously from the edge EYa over to the edge EYb.

In the above-described examples shown in FIGS. 9 to 17, advantageous effects similar to those of FIGS. 6 to 8 can be obtained. In the second embodiment, the concavities C21 are equivalent to first grooves, and the concavities C22 are equivalent to second grooves. Moreover, the resin layer 15 is equivalent to a second resin layer. The resin layer 15 may be formed in the concavities C2 shown in FIGS. 9 to 17.

Figure 18:
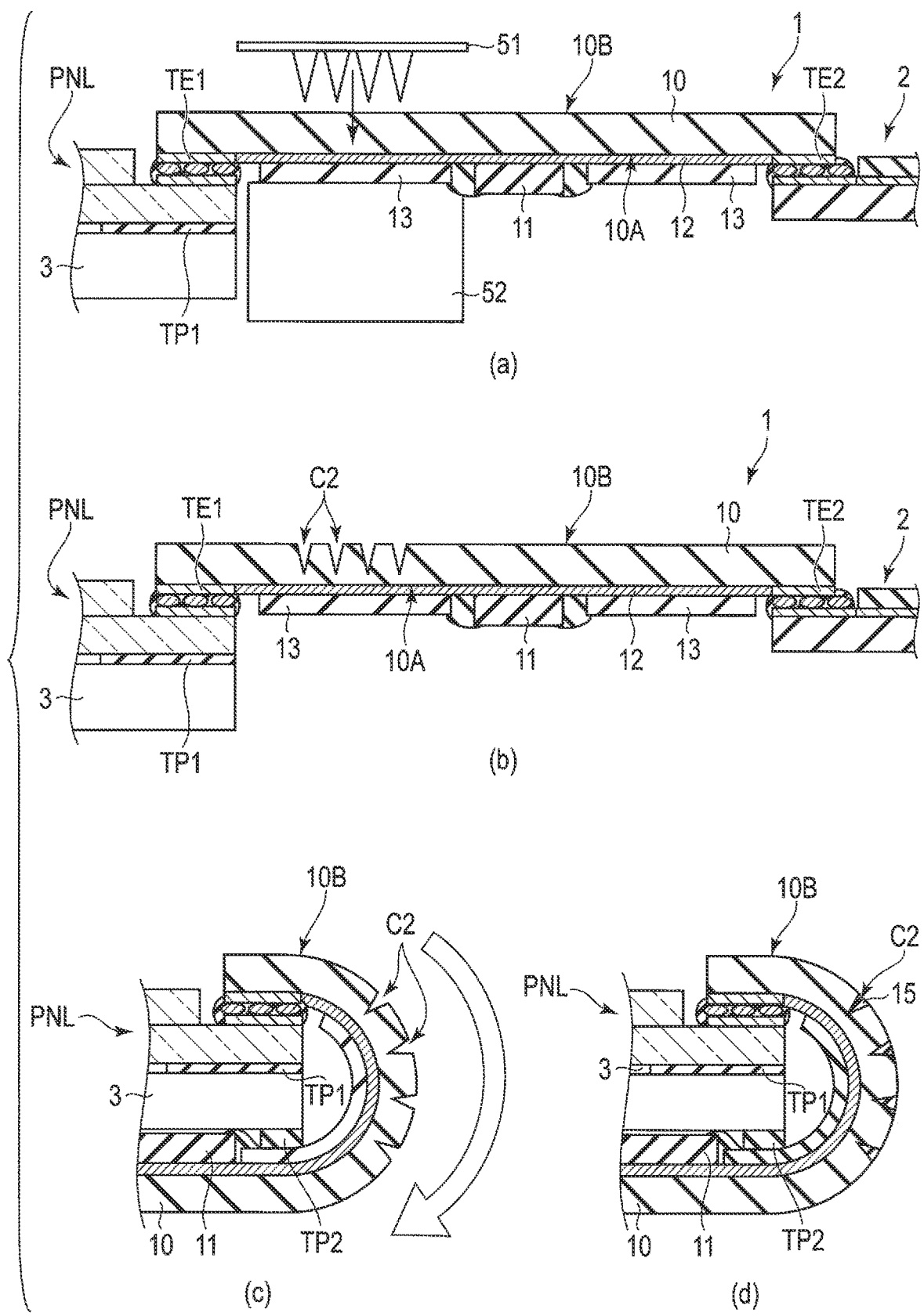
FIG. 18 is a diagram showing an example of the method of manufacturing a display device DSP comprising a concavity C2.

FIG. 18 is a diagram showing an example of a method of manufacturing the display device DSP comprising the concavities C2. In the example shown in FIG. 17, the concavities C2 are formed after the wiring board 1 is electrically connected to the display panel PNL and the wiring board 2.

As shown in FIG. 18, part (a), the wiring board 1 is disposed on a surface plate 52 to oppose blade teeth (etching teeth) 51. Here, the blade teeth 51 oppose a section of the second surface 10B, which is located between the display panel PNL and the IC chip 11. Next, the blade teeth 51 are descended toward the surface plate 52, and are pressed against the base 10 to such an extent that the blade teeth 51 does not penetrate the case. Thus, as shown in FIG. 18, part (b), the base 10 is cut a half way through, and thus the concavities C2 are formed in positions which overlap the resin layer 13 of the second surface 10B. The thickness of the base 10 in the concavities C2 is, for example, 15 µm or more but 25 µm or less. Next, as shown in FIG. 18, part (c), the wiring board 1 is bent so that the IC chip 11 is located in a rear surface side of the lighting unit 3, and the wiring board 1 and the lighting unit 3 are adhered together by the adhesive member TP2. After that, as shown in FIG. 18, part (d), the resin layer 15 is applied into the concavities C2, and thus the display device DSP is prepared.

Figure 19:
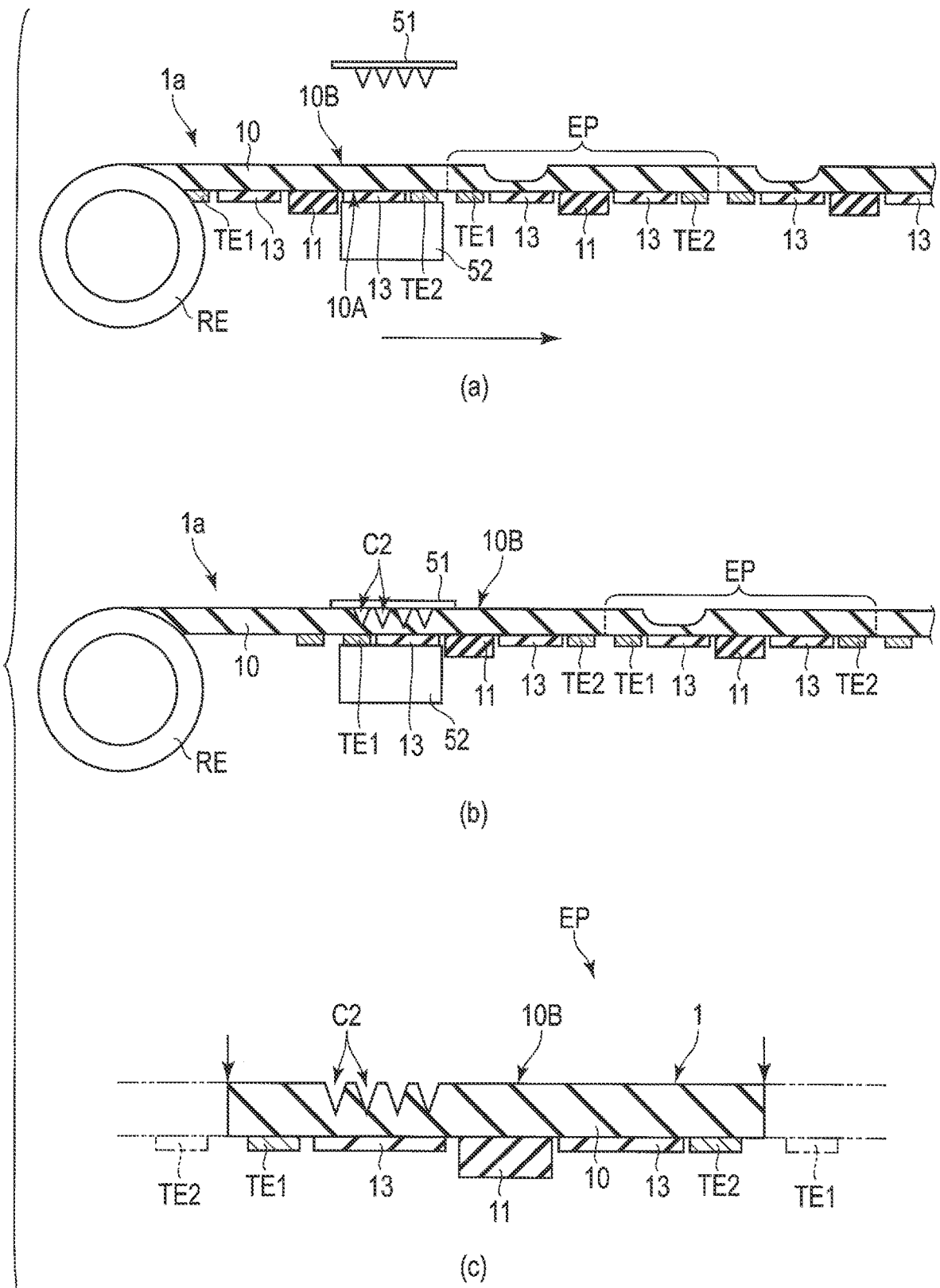
FIG. 19 is a diagram showing another example of the method of manufacturing a display device DSP comprising a concavity C2.

FIG. 19 is a diagram showing another example of a method of manufacturing the display device DSP comprising the concavities C2. In the examples shown in FIG. 19, the concavities C2 are formed before the wiring board 1 is electrically connected to the display panel PNL and the wiring board 2. More specifically, the concavities C2 are formed in the long-scale film 1a.

As shown in FIG. 5, part (a), for example, the long-scale film 1a is drawn out from the reel RE, and is placed on the surface plate 52. The blade teeth 51 are located on an upper portion of the long-scale film 1a, that is, a second surface 10B side of the base 10.

Next, as shown in FIG. 5 (b), when the long-scale film 1a is fed by a predetermined distance, and the blade teeth 51 oppose the section of the second surface 10B, which is located between the terminal TE1 and the IC chip 11. Subsequently, the blade teeth 51 are descended toward the base 10, and the blade teeth 51 are pressed against the base 10 to such an extent that the teeth do not penetrate the base 10. Thus, the base 10 is cut a half way through, and the concavities C2 are formed in the region between the terminal TE1 and the IC chips 11, that is, the region which overlaps the resin layer 13.

Next, as shown in FIG. 5 (c), the long-scale film 1a is divided into effective portions EP. The long-scale film 1a is cut in each region between each respective adjacent pair of a terminal TE1 and a terminal TE2. Thus, the wiring board 1 comprising the concavities C2 is prepared.

After that, the wiring board 1 is electrically connected to the display panel PNL and the wiring board 2, and the wiring board 1 is bent as in the example shown in FIG. 18. More specifically, as shown in FIG. 18, part (c), the wiring board 1 is bent so that the IC chip 11 is located in the rear surface side of the lighting unit 3, and the wiring board 1 and the lighting unit 3 are adhered together by the adhesive member TP2. Subsequently, as shown in FIG. 18, part (d), the resin layer 15 is applied into the concavities C2, and thus the display device DSP is prepared. Note that after the formation of the concavities C2, a washing step may be added if needed.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a display panel; and
a wiring board comprising a flexible base, a terminal electrically connected to the display panel, wherein
the flexible base including a first surface, a second surface on an opposite side to the first surface, and a plurality of concavities in the second surface,
the wiring board is mounted on the display panel and is bent so that the wiring board is opposed to a rear surface side of the display panel,
the concavities are provided in the portion of the wiring board which is bent, and
the concavities are formed into a mesh-like shape and intersect one another in a plan view.

2. The display device of claim 1, further comprising:
an IC chip, and
a wiring line which electrically connects the terminal and the IC chip,
wherein
the IC chip and the terminal is provided on the first surface, and
the concavities are arranged between the IC chip and the terminal.

3. The display device of claim 2, further comprising:
a first resin layer which covers the wiring line provided on the first surface,
wherein
the first resin layer overlaps the concavities.

4. The display device of claim 1, wherein
a thickness of the flexible base in the concavities is 15 μm or more but 25 μm or less.

5. The display device of claim 1, wherein
the concavities are dull.

6. The display device of claim 1, wherein
the concavities comprise a bottom portion, and
a length of the bottom portion is greater than a depth of the concavities.

7. The display device of claim 6, further comprising:
a lighting unit overlapping the display panel,
wherein
the wiring board is bent so that the IC chip is located on a rear surface side of the lighting unit, and
the length of the bottom portion is greater than a thickness of the lighting unit and the display panel.

8. The display device of claim 1, wherein
the flexible base comprises a first edge and a second edge on an opposite side to the first edge, and
the concavities are continuously formed from the first edge over to the second edge.

9. The display device of claim 2, wherein
the concavities comprise a bottom portion, and
a length of the bottom portion is less than a depth of the concavities.

10. The display device of claim 9, further comprising:
a lighting unit overlapping the display panel,
wherein
the wiring board is bent so that the IC chip is located on a rear surface side of the lighting unit, and further comprises a second resin layer placed in the concavities.

11. The display device of claim 9, wherein
the concavities comprise a first concave portion and a second concave portion spaced from the first concave portion, and
each of the first concave portion and the second concave portion is formed into a cross shape or a V shape.

12. The display device of claim 9, wherein
the concavities comprise a first concave portion and a second concave portion spaced from the first concave portion, and
each of the first concave portion and the second concave portion is formed into a linear shape with both end portions thereof bent.

13. The display device of claim 3, further comprising:
a third resin layer which covers the wiring line between the first resin layer and the IC chip.

14. A method of manufacturing a display device, the method comprising:
electrically connecting a wiring board including a flexible base comprising a first surface and a second surface on an opposite side to the first surface, to a display panel;
forming a plurality of concavities in a section of the second surface;
mounting the wiring board on the display panel; and
bending the wiring board so that the wiring board is opposed to a rear surface side of the display panel and the concavity is provided in the portion of the wiring board which is bent,
wherein the concavities are formed into a mesh-like shape and intersect one another in a plan view.

15. The method of claim 14, further comprising:
providing an IC chip and a terminal on the first surface so that the concavities are arranged between the IC chip and the terminal, and
providing a wiring line which electrically connects the IC chip and the terminal.

16. The method of claim 14, wherein
the concavities are formed by polishing.

17. The method of claim 14, wherein
the concavities are formed with blade teeth.

18. The method of claim 14, wherein
a thickness of the flexible base in the concavities is 15 μm or more but 25 μm or less.

19. The method of claim 15, comprising:
forming a first resin layer which covers the wiring line provided on the first surface before the forming of the concavities,
wherein
the concavities are formed in a position which overlaps the first resin layer.

20. The method of claim 16, comprising:
bending the wiring board after the forming of the concavities; and
placing a second resin layer in the concavities.

* * * * *